United States Patent [19]

Righi et al.

[11] 4,189,949
[45] Feb. 26, 1980

[54] PUSHBUTTON TUNER

[75] Inventors: Nardino Righi; Mario Canni Ferrari, both of Milan, Italy

[73] Assignee: Ri-El Ricerche Elettroniche S.p.A., Cologno Monzese, Italy

[21] Appl. No.: 924,485

[22] Filed: Jul. 13, 1978

[30] Foreign Application Priority Data

Jul. 14, 1977 [IT] Italy .................. 12691 A/77
May 12, 1978 [IT] Italy .................. 12611 A/78

[51] Int. Cl.² ............................................. F16H 35/18
[52] U.S. Cl. .................................... 74/10.33; 334/7
[58] Field of Search .................. 74/10.2, 10.33, 10.35, 74/10.37, 10.8; 334/7

[56] References Cited

U.S. PATENT DOCUMENTS

| 3,247,728 | 4/1966 | Wolf et al. | 74/10.33 |
| 4,030,052 | 6/1977 | Pelletier | 74/10.33 X |
| 4,133,214 | 1/1979 | Cicala | 74/10.35 X |

Primary Examiner—Werner H. Schroeder
Assistant Examiner—Moshe I. Cohen
Attorney, Agent, or Firm—Edwin E. Greigg

[57] ABSTRACT

The pushbutton tuner comprises a plurality of pushbutton assemblies arranged side by side parallel to each other. Each pushbutton assembly carries an abutment supporting member onto which there are provided two abutment members. Each abutment supporting member is mounted rotatably and angularly adjustable on the corresponding pushbutton assembly, and can be locked to any desired angular position with respect to the longitudinal axis of the pushbutton assembly. Whenever a pushbutton assembly is pushed inwardly for the selection of a desired predetermined broadcast frequency, firstly one of the said two abutment members abuts against an inclined edge of a V-shaped notch provided on the longitudinal side of a control bar operatively associated to the tuner group of the radio set, thus promoting the shifting of the said control bar in its longitudinal direction, until the second one of the said abutment members abuts against the other inclined edge of the said V-shaped notch of the control bar, thus stopping the movement of the control bar itself. The two abutment members act on the inclined edges of the V-shaped notch with thrust components which are equal and opposed.

7 Claims, 10 Drawing Figures

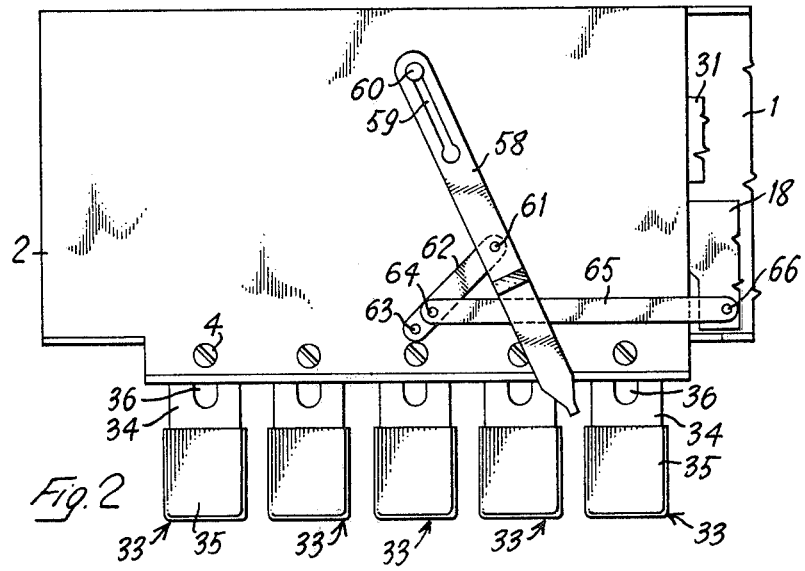
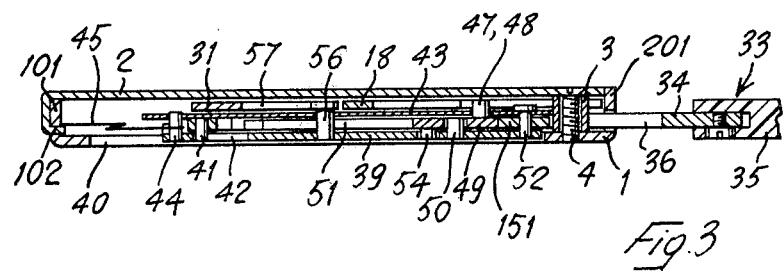
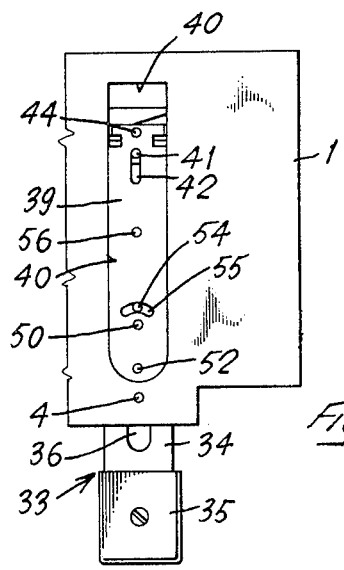

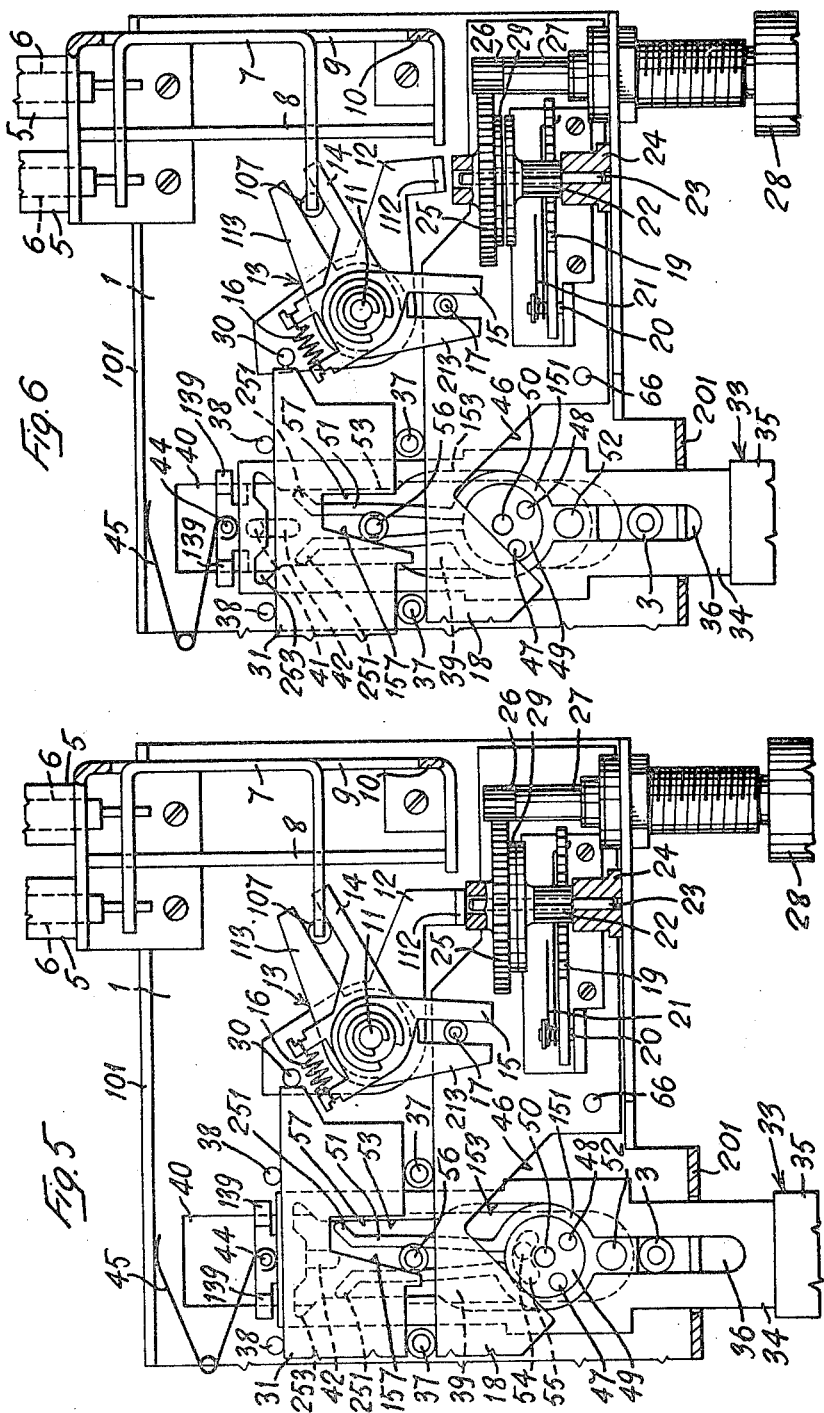

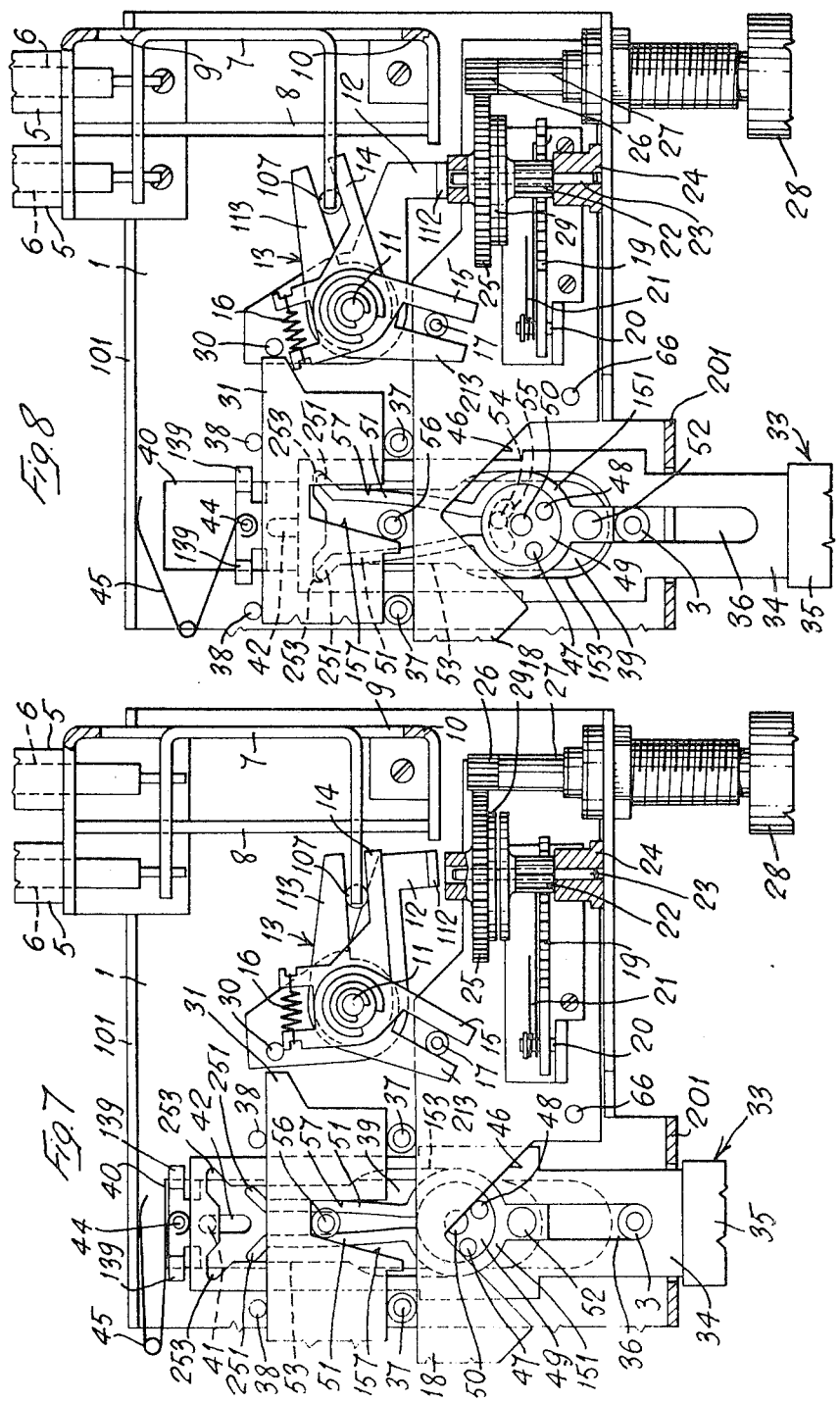

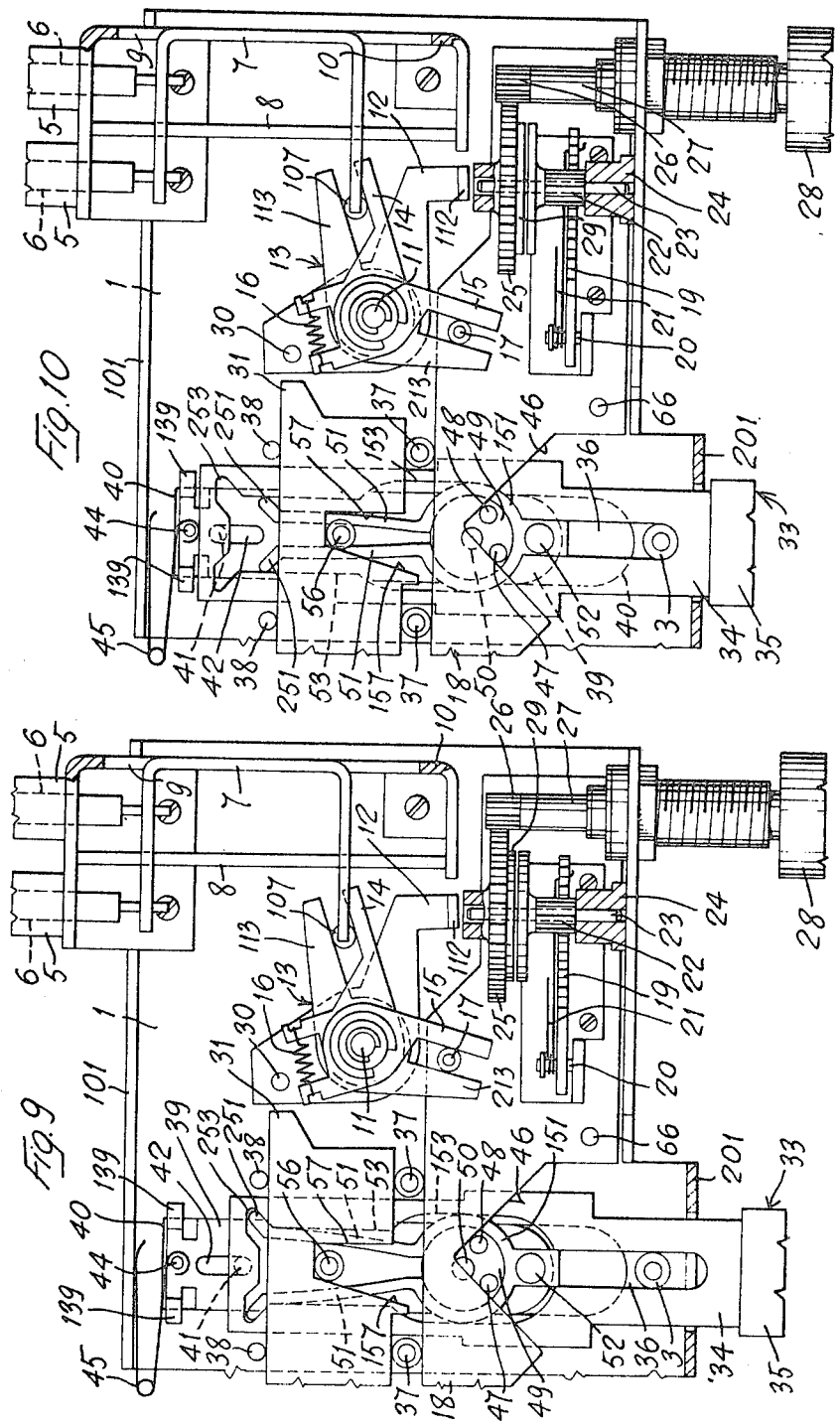

PUSHBUTTON TUNER

BACKGROUND OF THE INVENTION

1. Field of the Invention

The present invention relates to a pushbutton tuner for radio sets, television sets and other apparatus, and particularly for automobile radio sets or the like. A pushbutton tuner of this type presents a plurality of pushbutton assemblies mounted on the tuner frame for in and out movement, each one of these pushbutton assemblies carrying adjustable memory means for recalling a memorized broadcast frequency when the pushbutton assembly is pushed inwardly.

2. Statement of the Prior Art Known to the Applicants

The following prior art is known to the applicants:
U.S. Pat. No. 4,030,052 (PELLETIER): the whole document.
German (Federal Republic) Publication of Patent Application (OS) No. 2,614,610: the whole document.

3. Prior Art Pushbutton Tuners

Conventional pushbutton tuners comprise a plurality of pushbutton assemblies arranged side by side and parallel to each other, longitudinally slidable inside a tuner frame, and each carrying an abutment member which can be angularly adjusted around an axis which is perpendicular to the plane of the pushbutton assembly, and is associated to means for locking or unlocking same so as to adjust its angular position at will and maintain such position once adjusted. Each pushbutton assembly cooperates, by means of its abutment member, with the inclined edges of a V-shaped notch obtained in a control bar transversely arranged with respect to the pushbutton assemblies, said control bar being operatively associated to the tuner group of the radio set, so as to actually control same as a consequence of its longitudinal movement promoted by the insertion of any pushbutton assembly and by the consequent action of the abutment member on the inclined edge of the V-shaped notch.

In the known pushbutton tuners, the abutment member consists of a pin which is mounted angularly adjusted on each pushbutton assembly. Whenever a pushbutton assembly is pushed inwardly to select a predetermined frequency, the abutment pin rests, at the end of the inward movement of the pushbutton assembly, in the vertex angle of the associated V-shaped notch of the control bar. In this end position, the abutment pin normally results to be inclined with respect to the longitudinal axis of the pushbutton assembly and consequently also inclined with respect to the thrust force exerted by the pushbutton assembly. Consequently, a component of the said thrust is transmitted from the abutment pin to the control bar, in the longitudinal direction of the said control bar, and tends to longitudinally shift said control bar. As a consequence, in the pushbutton tuners of this type, the tuning cannot be very accurate, also in consideration of the fact that most of the times the pushbutton assemblies are pushed, by the user, with great force.

SUMMARY OF THE INVENTION

According to the present invention, the abutment element of each pushbutton assembly consists of at least two individual abutment members, spaced apart from each other and secured onto a same supporting element which is angularly adjustable with respect to the pushbutton assembly, in such a manner that, whenever the pushbutton assembly is pushed inwardly to select a predetermined frequency, firstly one of the said two abutment members abuts against one of the two inclined edges of the V-shaped notch, and promotes the longitudinal shifting of the control bar, until the other one of the said two abutment members abuts against the other inclined edge of the V-shaped notch, thus stopping the said control bar in correspondence of the selected frequency. It is evident that in this end position of their inward movement, the two abutment members of each pushbutton assembly exert thrust forces against the opposed sides of the same V-shaped notch, so that the components of their thrusts, in the longitudinal direction of the control bar, are equal and opposed and therefore mutually eliminate each other.

The above and other characteristic features of the invention, and particularly the means for the locking and unlocking of the supporting element of the two abutment members, for the adjustment of their angular position on the pushbutton assemblies, will appear evident from the following detailed description of a preferred embodiment thereof, illustrated by way of example on the attached drawings.

BRIEF DESCRIPTION OF THE DRAWINGS

FIG. 2 is a partial view from the top of the pushbutton tuner.

FIG. 3 is a longitudinal section showing a pushbutton assembly in its rest position.

FIG. 4 is a partial view from the underside of the pushbutton tuner, in correspondence of a pushbutton assembly.

FIGS. 5, 6 and 7 show from the top three subsequent positions of the same pushbutton assembly upon insertion of a desired broadcast frequency associated to the said pushbutton assembly.

FIGS. 8, 9 and 10 show from the top three subsequent positions of the same pushbutton assembly upon changing a new broadcast frequency to be associated to the said pushbutton assembly.

DESCRIPTION OF THE PREFERRED EMBODIMENT

Figure 1:
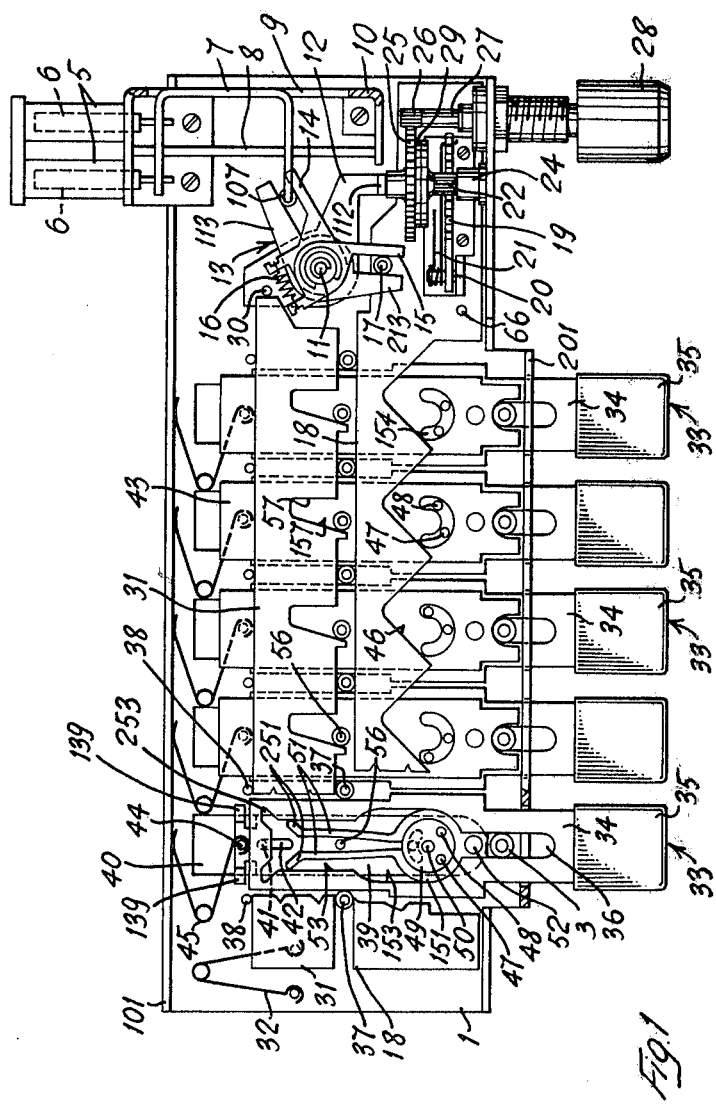
FIG. 1 is a plan view from the top of a pushbutton tuner according to the invention, without its cover plate, and with some parts in section.

The frequency selector device or tuner for radio sets, television sets and other apparatus, particularly for automobile radio sets or the like, consists of a base plate 1 above which, at a certain distance from same, there is arranged a cover plate 2 which engages, by means of hooks 102, corresponding slots provided in the rear edge 101 of the base plate 1 and is secured to this latter by means of spacing bushings 3 and of screws 4 (see FIG. 3).

As particularly shown in FIGS. 1 and 5 to 8, on a side extension of the base plate 1 there is mounted the tuner group of the radio set. In the illustrated embodiment, the said tuner group consists of a plurality of electrical coils 5, presenting cores 6 which are axially movable and can be inserted according to variable measures within the coils 5 so as to consequently modify the tuning frequency. To this purpose, the cores 6 are secured to a U-shaped supporting member 7, which is slidably mounted with its arms onto a guide rod 8, and with its traverse (connecting the two arms) in a guide slot 9 provided on a coil-supporting member 10 secured to the base plate 1.

Next to the tuner group, on the base plate 1 there is secured a pin 11 onto which there are swingably mounted the four small levers 12, 13, 14 and 15. The two upper levers 14 and 15 are each associated to an arm 113 or 213 of the underlying lever 13 presenting two arms and are urged by an interposed spring 16 towards the respective arm 113, 213 of the said lever 13, thus practically forming a single composite angle lever, each arm of which consists of an elastic fork or pincers 113-14 and 213-15. Into the elastic fork arm 113-14 of said composite lever 13, 14, 15 there is engaged the pin 107 of the supporting member 7, to which there are secured the cores of the tuner group. Into the other elastic fork arm 213-14 of the composite lever 13, 14, 15 there is engaged a pin 17 integral with a flat slide bar 18 which carries a rack 19. Said rack 19 is swingably fulcrumed at 20 to the plate 18 and meshes with a pinion 22, being urged thereagainst under the action of a spring 21. The pinion is rotatably mounted on a shaft 23 which is mounted projecting from a support 24 secured to the base plate 1. On the free end of shaft 23 there is freely rotatably mounted a gear 25 which meshes with a pinion 26 integral to the shaft 27 of a rotatable knob 28 for the manual tuning. The said gear 25 is coupled to the coaxial pinion 22 by means of a friction clutch 29 which is kept in engaged position by means of the lever 12 mounted on pin 11. To this purpose, against a pin 30 of the said lever 12 there bears the end of a flat slide bar 31, parallel to bar 18 and urged against the lever 12 under the action of a spring 32. In this manner, the lever 12 bears with a wing 112 frontally against the hub of gear 25 and keeps engaged the friction clutch 29 between the said gear 25 and pinion 22.

From the above it appears evident that, by manually rotating the knob 28, the said knob 28 drives, through shaft 27 and pinion 26, the gear 25 which on its turn drives, through friction clutch 29, the pinion 22. Pinion 22 longitudinally shifts the bar 18 by means of rack 19. The bar 18 angularly shifts (by means of its pin 17) the composite lever 13, 14, 15 which on its turn shifts, by means of pin 107, the slidable supporting member 7 which carries the cores 6 of the tuner group.

Between the base plate 1 and the two flat slide bars 18, 32 there are arranged side by side and parallel to each other, a plurality of pushbutton assemblies 33 consisting each of a thin slide 34 which is slidably guided through the front edge 201 of the base plate 1 and is provided with an actuation head (pushbutton) 35. Each pushbutton assembly 33 is slidably guided in its longitudinal direction. To this purpose, the slide 34 of each pushbutton assembly presents, in the zone of its forward end, a longitudinal slot 36, which is engaged by one of the connecting screws 4 between the base plate 1 and the cover plate 2, with the respective spacing bushing 3. At the two sides of the slide 34 of each pushbutton 33 there are moreover provided guiding pins 37, 38, secured to the base plate 1 and which serve also as guide elements for the two slide bars 18 and 31 in their longitudinal direction. Under the slide 34 of each pushbutton 33 (see FIGS. 3 and 4) there is provided an additional slide element 39 which is slidably housed in a corresponding slot 40 provided in the base plate 1. Corresponding to its rear end, the slide element 39 presents two side guide flanges 139 which are superposed over the base plate 1. Each slide element 39 is coupled to the slide 34 of the corresponding pushbutton 33 in a relatively slidable manner within certain limits in the longitudinal direction of the pushbutton. To this purpose, the slide pushbutton 34 carries a pin 41 which engages a longitudinal slot 42 of the slide element 39. On its upper side, the slide 34 of each pushbutton assembly 33 is covered by a thin protection plate 43 which is secured to the lower slide element 39 by means of a pin 44 provided at the end of the said slide element 39. Onto said rear pin 44 there acts a return spring 45 which tends to displace the respective slide element 39 towards the exterior and to bring it, together with pushbutton 33, to a rest position shown in FIGS. 1 to 5.

Above the pushbutton assemblies 33, between said assemblies and the cover plate 2, and transversally to the said pushbutton assemblies, there are arranged the flat bars 18 and 31. The transverse bar 18 which is coupled to the tuner group, presents on its forward edge, in correspondence of each pushbutton assembly 33, a V-shaped notch 46.

The said V-shaped notch cooperates with an abutment element provided on the respective pushbutton assembly and consisting of two individual abutment members 47, 48, secured on the upper side of the common supporting element consisting of a small circular disc 49 which is rotatably mounted on a center pin 50 fixed to the slide element 39. The disc 49 is encircled and tightly clasped by the eyelet-shaped head 151 of a fork spring 51, secured to the underlying slide element 39 in correspondence of a front extension of its eyelet head 151 by means of a pin 52 serves also as a further fastening element for the protection plate 43. The fork spring 51 and the disc 49 clasped by same are housed in a longitudinal opening 53 of the slide 34 of the pushbutton assembly 33, while the two abutment members 47, 48, project upwardly from slide 34 through an arc-shaped slot 154 provided in the protection plate 43, concentrically with respect to the rotation axis 50 of the disc 49. The said abutment members 47, 48 which for example consist of small pins, cooperate with the inclined edges of the associated V-shaped notch 46 of the transverse bar 18. In the illustrated embodiment, the abutment members 47, 48 are arranged along the same circumference concentrically to the rotation axis 50 of the disc 49 and are angularly offset by 90°. The rotation of the disc around its axis 50 is also limited to 90° by means of a pin 54 which is excentrically secured to the lower face of the disc 49 and engages an arc-shaped slot 55 provided on the underlying slide element 39 concentrically to the rotation axis 50 of disc 49 and extending along an angle of 90° symmetrically with respect to the longitudinal median axis of the pushbutton assembly 33, as it appears in FIG. 4.

The longitudinal opening 53 of the slide 34 of each pushbutton assembly 33 presents a forward end 153 which is slightly enlarged and has the edges parallel to each other, and inside which there is housed and it can longitudinally slide within certain limits, the eyelet head 151 of the fork spring 51, together with the disc 49 which carries the abutment pins. The free rear ends 251 of the two arms of the fork spring 51 are outwardly bent and elastically bear against the respective edges of the opening 53. The rear end 253 of the opening 53 presents a V-shaped enlargement, or it presents two deep opposed side notches.

To the slide element 39 of each pushbutton assembly 33 there is secured an abutment pin 56 which projects upwardly through the opening 53 of the slide 34 and through the overlying protection plate 43, and it cooperates with the inclined edge 157 of a notch 57 provided in the other transverse bar 31 in correspondence of each pushbutton assembly 33.

Each pushbutton assembly 33 is associated to a predetermined selected frequency, at which the tuner group 5, 6 is automatically adjusted by means of the transverse control bar 18 when the pushbutton 33 is pushed inwardly from its rest position. In the mentioned rest position of the pushbutton assemblies, illustrated in FIGS. 1 to 5, the pairs of abutments members 47, 48 are out of engagement from the transverse control bar 18 of the tuner group, so that this bar 18 may freely slide when the tuning on the desired frequency is manually effected by means of knob 28, as previously described. The pairs of abutment members 47, 48 of all pushbutton assemblies 33 are locked in their respective angular position. In fact, the slide element 39 and the slide 34 of each pushbutton 33 are in a position in which the fork spring 51 is positioned forwardly inside the longitudinal opening 53 of the slide 34, i.e. towards the actuation head 35 of the pushbutton assembly 33. Consequently, the ends 251 of the two arms of the fork spring 51 are positioned in the narrower zone of the said opening 53 and are brought close to each other, and in this manner the eyelet head 151 of spring 51 clasps the disc 49 and locks same, together with the pair of abutment members 47, 48, in the predetermined angular position.

In order to select a desired transmitting station by means of the pushbutton, the pushbutton assembly 33 associated with the desired frequency is pushed inwardly. The slide 34 of the actuated pushbutton assembly entrains immediately also the slide element 39 by means of the pin 41 located in correspondence of the rear end of the slot 42.

At the beginning of its inward movement, the abutment pin 56 of the pushbutton assembly, by sliding against the inclined edge 157 of the notch 57 of the transverse bar 31, shifts the said bar 31 longitudinally against the action of the respective spring 32, i.e. towards the left in FIGS. 1 and 5 to 10, so that the bar 31 moves away from the pin 30 provided on lever 12. The wing 112 of said lever is not compressed any more against the gear 25, so that the friction clutch between the said gear 25 and the pinion 22 (as shown in FIG. 6) is disengaged. In this manner there is temporarily disengaged the coupling between the bar 18 controlling the tuner group 5, 6 and the knob 28 for the manual tuning. During the further inward movement of the pushbutton assembly 33, the pin 56 continues to slide against the inclined edge of the notch 57 of the transverse bar 31, thus maintaining this latter in the position of disengagement of the friction clutch 29.

In the course of the said further inward movement of the pushbutton assembly 33, one of the two abutment members of the pair of abutment members 47, 48 secured onto disc 49 (for example the left one 47, in FIG. 6), abuts against the respective inclined edge of the corresponding V-shaped notch 46 provided in the bar 18 which controls the tuner group, and, by sliding against said edge, it shifts in longitudinal direction the said control bar 18 (for example towards the left, in FIG. 6) until the other abutment member of the said pair 47, 48 (for example the right one 48, in FIG. 6) abuts against the other corresponding inclined edge of the V-shaped notch 46, thus stopping the longitudinal shifting of the transverse bar 18, as illustrated in FIG. 7. In this position, the thrusts exerted by the two abutment members 47, 48 in the longitudinal direction of the pushbutton assembly 33, against the respective opposed inclined edges of the same V-shaped notch 46, present both a component which is directed in the longitudinal direction of the bar 18, but the said components are equal and opposed, so that they eliminate each other. The pair of abutment members 47, 48 does not exert any force therefore (when the pushbutton assembly 33 reaches the end of its inward run) in the longitudinal direction of the transverse control bar 18. The said bar 18 is therefore shifted and brought with the maximum accuracy to a position which corresponds to the frequency associated to the pushbutton assembly 33, and it shifts on its turn the composite lever 13, 14, 15 thus adjusting the tuner group 5, 6 to the frequency associated to the actuated pushbutton assembly.

By letting free the actuated pushbutton assembly, this latter is again brought by the respective return spring 45 and by the pin 41 to its rest position illustrated in FIG. 5, allowing the transverse bar 31 to return to its rest position under the action of spring 32. In this manner, the transverse bar 31 again puts into engagement condition the friction clutch 29 between the gear 25 and pinion 22, by means of lever 12. The bar 18 controlling the tuner group is instead maintained (due to the action of the friction forces and of the several resistances in the mechanisms associated thereto) in the position in which it was brought by the actuated pushbutton assembly. A more accurate tuning at the frequency selected by pushbutton 33 (if it should be necessary) can be effected by means of the manual control knob 28 and of the mechanism 26, 25, 19, 22, 19 since the friction clutch 29 is again engaged and the control bar 18 is not engaged by any of the pushbutton assemblies 33, and therefore it can be shifted freely, whenever it is entrained by pinion 27 through rack 19.

In order to change and pre-arrange the frequency associated to a pushbutton 33, the same is pulled outwardly from its rest position of FIG. 5 and brought to a position of unlocking of the abutment members 47, 48 as shown in FIG. 8. In the rest position of the pushbutton 33, the slide element 39 engaged in the opening 40 of the base plate 1, adheres, with its rounded forward end, against the correspondingly shaped end of said opening 40, as it results more particularly from FIGS. 3 and 4. Consequently, said slide element 39 and the abutment-carrying disc 49 mounted thereon, as well as the fork spring 51 which clasps, with its eyelet-shaped end 151, the said disc 49, cannot follow the said outward movement of the pushbutton assembly 33 and therefore effect a rearward motion relatively to the slide 34 of the pushbutton assembly. The abutment-carrying disc 49 and the fork spring 51 move, during said relative motion, along the longitudinal opening 53 of the slide 34 and assume, at the end of said relative motion, an unlocking position, at which the ends 251 of the fork spring 51 are housed inside the enlarged rear end 253 of the said opening 53, and therefore open out the one apart from the other, as illustrated in FIG. 8. Said opening apart of the ends 252 and consequently of the arms of the fork spring 51 causes a slackening of the clasp exerted by the eyelet head 151 of the fork spring 51 on the abutment-carrying disc 49, so that the said disc 49 is unlocked, i.e. it can freely rotate inside the eyelet head 151 of the spring 51, together with the pair of abutment members 47, 48 and with the pin 54 movable at the interior of the arc-shaped slot 55 of the slide element 39.

In this unlocked position of the abutment-carrying disc 49, the radio set is tuned, by means of the manual knob 28, at the new broadcast frequency which is to be associated to the pushbutton assembly 33, thus shifting the transverse bar 18 to a position corresponding to said frequency, for example from the position according to FIG. 7 to the position according to FIG. 8. Subsequently, the pushbutton assembly 33 is pushed inwardly from the position of FIG. 8 to the position of FIG. 10, thus drawing along the slide element 39 together with the disc 49 and the fork spring 51, since the outwardly bent ends 251 of the arms of the spring 51 engage the corresponding side notches of the rear end 253 of the opening 53 of the slide 34 of pushbutton assembly 33, thus coupling said slide 34 to the slide element 39. During said inward movement of the pushbutton assembly 33, either one of the pair of abutment members 47, 48 of disc 49 abuts first (with respect to the other) against the respective inclined edge of the corresponding V-shaped notch 46. In the illustrated embodiment, the left abutment member 47 will meet first the left inclined edge of the V-shaped notch 46, as it clearly results from FIG. 8. In consideration of the fact that the pair of abutment members can be at the moment freely moved to any direction together with the disc 49, the abutment 47 which first meets the inclined edge of the V-shaped notch 46, does not promote the longitudinal shifting of the bar 18, but is causes the rotation of the abutment-carrying disc 49 around its axis, inside the eyelet head 151 of the spring fork 51, until the other abutment member 48, the right one in the illustrated example, does not abut against the respective inclined edge of the V-shaped notch 46 as illustrated in FIG. 9. In this manner, the rotation of the abutment-carrying disc 49 is stopped at an angular position of the pair of abutment members 47, 48, which corresponds to the longitudinal position of the bar 18, and consequently to the frequency associated to said position. Also in this case, the forces exerted by the two abutment members 47, 48 are equal and opposed, so that they mutually compensate each other and do not tend to shift the bar 18.

By further prosecuting the inward movement of the pushbutton assembly 33, from the intermediate position of FIG. 9 to the final position of FIG. 10, only the slide 34 is shifted, since the slide element 39 is stopped by abutment of the abutment members 47, 48 against the transverse bar 18. The abutment-carrying disc 49 and the fork spring 51 therefore do not move any more, while the slide 34 of the pushbutton element 33 moves further inwardly. Consequently, the spring 51 and the disc 49 move relatively forward with respect to the slide 34, i.e. towards the forward end of the opening 53, and assume their rest position with respect to the said slide 34, at which position the ends 251 of the arms of the spring 51 are withdrawn from the enlarged rear end 253 of said opening 253 towards the narrower portion of the said opening, as shown in FIG. 10. In this manner, the ends 251 of the two arms of the fork spring 51 are again brought close to one another, so that the spring 51 clasps by means of its eyelet head 151 the abutment-carrying disc 49 in such a manner as to again lock same and to avoid its rotation, i.e. to eliminate any possibility of angular shifting of the pair of abutment members 47, 48. By freeing the pushbutton assembly 33, same is brought again under the action of return spring 45, to its rest position of FIG. 5, together with the slide element 39 and consequently together with the fork spring 51 and with the abutment-carrying disc 49, which latter maintains its angular position corresponding to the frequency associated to the position of the transverse control bar 18. Consequently, the pair of abutment members 47, 48 will cause the shifting of the said bar 18, controlling the tuner group, into the same position, and will therefore insert the same frequency, each time that the corresponding pushbutton assembly 33 is pushed inwardly.

In order to indicate the inserted frequency on a graduated scale (not illustrated), on the outer side of the cover plate 2 there may be provided a tuning index 58 which is fulcrumed by means of a slot 59 onto a fixed pin 60, as shown in FIG. 2. Said index 58 is hinged at 61 to a swinging lever 62, fulcrumed in 63 to the cover plate 2. Said lever 62 is hinged at 64 to a connecting lever 65 which on its turn is hinged at 66 to the bar 18 which controls the tuner group 5, 6.

Of course, the invention is not limited to the described and illustrated embodiment, but is can be broadly modified and changed, particularly in its construction. More particularly changes may be brought to the angularly shiftable means which support the pair of abutment members 47, 48 and the means for locking and unlocking the angular movement of the said pair of abutment members 47, 48, as well as the means for the coupling of the transverse bar 18 to the tuner group. Instead of open V-shaped notches 46, the transverse control bar 18 may present openings having a closed contour and presenting a V-shaped portion, inside which openings there are engaged and are movable the pair of abutment members 47, 48. The whole without departing from the inventive principle as above described and claimed hereafter.

We claim:

1. A pushbutton tuner particularly adapted for automobile radio sets, comprising a plurality of pushbutton assemblies arranged side by side and parallel to each other, each pushbutton assembly being movable in its longitudinal direction and carrying an abutment element which is angularly adjustable around an axis which is perpendicular to the plane of the pushbutton assembly, locking means for locking the said abutment element in a predetermined angular position, said abutment element cooperating with two inclined edges of a V-shaped notch or opening obtained in a control bar slidably arranged transversely with respect to the pushbutton assemblies, said control bar being operatively connected with the tuner group of the radio set, wherein the improvement consists in the fact that the abutment element of each pushbutton assembly comprises at least two abutment members secured onto a common supporting element which is mounted angularly adjustable on the pushbutton assembly, whereby, whenever the pushbutton assembly is pushed to a position for the selection of the desired frequency, firstly one of the said abutment members abuts against one of the two inclined edges of the said V-shaped notch of the control bar, and promotes the shifting of the said control bar in its longitudinal direction, until the other one of the said abutment members abuts against the other one of the inclined edges of the said V-shaped notch.

2. A pushbutton tuner according to claim 1, in which the common supporting element of the two abutment members consists of a disc rotatably mounted on the pushbutton assembly, and the said two abutment members are secured to said disc angularly offset the one with respect to the other, along a circumference which is concentric to the axis of rotation of the said disc.

3. A pushbutton tuner according to claim 2, in which the disc which carries the two abutment members is clasped by the eyelet head of a fork spring, means being provided for opening apart the arms of said fork spring, in such a manner to permit the rotation of said disc, further means being provided for closing or drawing near the said arms of the fork spring, in such a manner as to lock the disc against rotational movement.

4. A pushbutton tuner according to claim 3, in which the disc carrying the abutment members and the fork spring are housed in a longitudinal opening obtained in a first slide of the pushbutton assembly, and are mounted on an additional slide element which is slidably guided in the longitudinal direction of the pushbutton assembly, and coupled to the said first slide in such a manner as to be capable of sliding with respect to the said first slide in the same longitudinal direction so as to move from a locking position, in which the extremities of the arms of the fork spring are positioned in a narrow portion of the said longitudinal opening, and therefore are near the one to the other, to an unlocking position in which the extremities of the arms of the fork spring are positioned in an enlarged portion of the said longitudinal opening, and therefore are opened apart from each other.

5. A pushbutton tuner according to claim 4, in which the longitudinal movement of the additional slide element with respect to the first slide is limited by a pin secured to either one of the said two above mentioned components and engaging a slot provided in the other one of the said components.

6. A pushbutton tuner according to claim 4, in which the extremities of the arms of the fork spring are outwardly bent, and are intended to engage corresponding recesses or notches obtained in the sides of the said longitudinal opening of the first slide.

7. A pushbutton tuner according to claim 1 in which the control bar operatively connected with the tuner group of the radio set is coupled to the said tuner group and also to the manual control means of the said tuner group, the coupling to the said manual control means being obtained through a friction clutch, means being provided for the engagement and disengagement of the said friction clutch upon axial movement of each pushbutton assembly.

* * * * *